United States Patent [19]

Poujois

[11] Patent Number: 4,614,937
[45] Date of Patent: Sep. 30, 1986

[54] CAPACITIVE KEYBOARD STRUCTURE

[75] Inventor: Robert Poujois, Sinard, France

[73] Assignee: Commissariat a l'Energie Atomique, Paris, France

[21] Appl. No.: 457,439

[22] Filed: Jan. 12, 1983

[30] Foreign Application Priority Data

Jan. 29, 1982 [FR] France ................. 82 01445

[51] Int. Cl.⁴ ............................................. G06F 3/02
[52] U.S. Cl. ............................... 340/365 C; 200/5 A; 340/365 R
[58] Field of Search ............... 200/DIG. 1, 5 A; 307/116; 340/365 C, 365 R; 361/181, 288

[56] References Cited

U.S. PATENT DOCUMENTS

| | | | |
|---|---|---|---|
| 4,055,735 | 10/1977 | Eachus | 340/365 C |
| 4,125,783 | 11/1978 | Sefton | 340/365 C |
| 4,194,083 | 3/1980 | Abe | 340/365 C |
| 4,233,522 | 11/1980 | Grummer | . |
| 4,288,786 | 9/1981 | Ledniczki | 340/365 C |
| 4,359,720 | 11/1982 | Chai | 340/365 C |
| 4,543,564 | 9/1985 | Audoin | 340/365 C |

FOREIGN PATENT DOCUMENTS

| | | | |
|---|---|---|---|
| 2746655 | 10/1977 | Fed. Rep. of Germany | . |
| 2026745 | 2/1980 | United Kingdom | 340/365 C |
| 1582640 | 1/1981 | United Kingdom | 340/365 C |

Primary Examiner—John W. Caldwell, Sr.
Assistant Examiner—Michael F. Heim
Attorney, Agent, or Firm—Kerkam, Stowell, Kondracki & Clarke

[57] ABSTRACT

A capacitive keyboard structure, the keyboard comprising on one face of a substrate a series of static sensitive keys each associated with a pair of electrodes: an emitting electrode excited sequentially by an alternating signal supplied by an emitting line and a receiving electrode which is coupled capacitively to the emitting electrode by the corresponding key and on which a receiving line collects the variations of the signal as an effect of possible presence of a user's finger in the neighbourhood of the key, wherein the electrodes of one same type are disposed on such face, the electrodes of the other type being disposed on the other face of the substrate, thus avoiding the crossing of the emitting and receiving lines.

Application to the control of an industrial or publicly available apparatus.

11 Claims, 7 Drawing Figures

CAPACITIVE KEYBOARD STRUCTURE

BACKGROUND OF THE INVENTION

Of course, capacitive keyboards enable a predetermined order to be carried out by the presence of a finger in the vicinity of a sensitive key, the expression "in the vicinity" also including cases in which the finger is in contact with the sensitive key. Keyboards of the kind specified are becoming more and more widely used, both for industrial and scientific applications (for controlling industrial or scientific apparatuses), and also in public places and for the control of apparatuses, for example, electric domestic appliances intended for the public.

PROBLEM

First of all, to define the various problems solved by the invention, the known operation of a capacitive keyboard of the kind specified will be recalled. Generally, capacitive keyboards use the fact that the presence of a user's finger in the vicinity of one or more conductive armatures creates electrical capacities between the finger and the armatures, thus modifying the capacities existing between the armatures.

Such capacitive keyboards are known which comprise, as is shown diagrammatically in FIG. 1, sensitive keys G each associated with a pair of subjacent electrodes—i.e., on the one hand an emitting electrode A excited sequentially by an alternating signal supplied by an emitting line X, and on the other hand a receiving electrode B capacitively coupled to the emitting electrode A by the corresponding sensitive key G. A receiving line Y collects on the receiving electrode B the variations of the amplitude of the alternating signal as an effect of the possible presence of the user's finger 1 in the vicinity of the key G.

FIG. 2 is the equivalent electric circuit diagram of such a key; it shows an emitting line (input line) X, a receiving line (output line) Y, and two so-called "active" capacities $C_1$, $C_1'$, and a so-called "direct" capacity $C_2$. The capacity $C_1$ represents the capacity between the electrode A and the key G, the capacity $C_1'$ represents the capacity between the key G and the electrode B, and the capacity $C_2$ represents the direct capacitive coupling between the emitting electrode A and the receiving electrode B. The presence of the user is shown diagrammatically by a shunt 2, (FIG. 2) between the point common to the capacities $C_1$ and $C_1'$ and earth, such shunt comprising a first capacitor 3 of a capacity close to 4 picofarads, to represent the user's finger, and a capacity 4 of the order of 60 picofarads, to represent the capacity of the user's body in relation to the ground. A switch I therefore show diagrammatically the presence or absence of the user's finger 1 on the key G. The preceding data are based on the experimental observation of the fact that the body of a person can be represented by an electrically conductive body which has in relation to the ground an average capacity of about 60 picofarads, when the person is wearing insulating footwear. When a user's finger approaches the sensitive key G, it creates therewith a capacity which may vary from 2 to 5 picofarads, inter alia in dependence whether the finger is gloved or not; it is the presence of that capacity which the capacitive keyboard is intended to detect.

FIG. 2 also shows a load impedance Z situated between a receiving line Y and earth, such impedance Z diagrammatically representing the measuring electronics. In the known applications of such capacitive keyboards, the two possible positions of the switch I are detected by measuring the voltage collected at the terminals of Z, or the current in the impedance Z, or else the dephasing between the emitter at the input and the receiving signal at the output. In a general way, the presence of the user's finger corresponding to a current shunt via the line 2 is therefore expressed by a reduction in the voltage on the line Y, due to the fact that the impedance increases between the input X and the output Y. Clearly, therefore, by examining the preceding variations on the impedance Z at the output of the receiving line Y it is possible to determine in each case that particular sensitive key G of the capacitive keyboard on which the user's finger 1 has been place.

The description of the prior art will now be completed with a few details about the way in which the various sensitive keys and emitting and receiving electrodes of one and the same capacitive keyboard connected to the outside. The simplest way in which to design such connections is to provide an emitting line for each emitting electrode, and a receiving line for each receiving electrode, in which case the circuit diagram (FIG. 2) is repeated as many times as there are sensitive keys G in the keyboard. Nevertheless, if it is a keyboard of any size, this method of procedure of course results in a very large number of connections, which it is difficult to accommodate without problems in the same keyboard structure. This is the reason why, fairly frequently, a supply and reading are used which take a matrix form, the different emitting and receiving electrodes being distributed at the apexes of a rectangular matrix, as shown in FIG. 3. As shown in FIG. 3, the different emitting electrodes $A_{ij}$ and receiving electrodes $B_{ij}$ are distributed in a matrix network comprising inputs $X_1, X_2, \ldots, X_j, \ldots$ for each column and output $Y_1, Y_2, \ldots, Y_i, \ldots$ for each line of the matrix network. FIG. 3 is limited to the electrical assembly diagram of the emitting electrodes $A_{ij}$ and receiving electrodes $B_{ij}$, the different sensitive keys $G_{ij}$ not being shown; they must be considered to lie outside the plane of the drawing, above each of the pairs of electrodes $A_{ij}$ and $B_{ij}$. To produce and read the signals delivered by the keyboard, a sequential alternating supply is used which arrives in the form of pulses successively on each column $X_j$, at the same time supplying all the electrodes $A_{ij}$ corresponding to a predetermined value of j. Then the output signal is observed by seeking that line $Y_i$ which shows a reduction in signal. When this observation has been made, it is known that the key $G_{ij}$ was actuated, if at the same moment the column $X_j$ is excited by the alternating train of sequential pulses. Clearly, the main advantage of this type of matrix keyboard is the reduction in the number of wires coming out of the keyboard to supply and read the orders which it receives.

Nevertheless, such a matrix-type keyboard sets a problem as regards the crossings of the interconnecting wires. This problem is solved in some keyboards in which the corresponding emitting electrodes $A_{ij}$ and receiving electrodes $B_{ij}$ are not exactly in the same horizontal plane; this precisely facilitates the crossings of the interconnecting wires. Those keyboards use two electrically insulating layers or substrates in their construction: a first substrate which bears the sensitive keys on its upper face, and a second substrate which can be a printed circuit which is disposed below the first one and bears on one face the emitting electrodes $A_{ij}$ with their associated lines $X_j$, and on the other face the receiving electrodes $B_{ij}$ with their associated lines $Y_i$. Other keyboards are also known in which the second substrate bears on one face the emitting electrodes $A_{ij}$ and the receiving electrodes $B_{ij}$ and also the receiving lines $Y_i$, and on the other face the emitting lines $X_j$ electrically connected to the emitting electrodes $A_{ij}$ by metallized holes passing through the second substrate. These two types of keyboard therefore have the disadvantage of requiring two substrates in their construction, and this is expensive.

Moreover, one of the main qualities required in capacitive keyboards lies in their sensitivity, which must be as high as possible, at one and the same time in order to obtain an unambiguous response each time a user's finger comes near, even when the user has insulating gloves which considerably reduce the capacity added by his or her finger, and also to allow the recognition, with the least possible chance or error, of a triggering signal, even in the presence of relatively considerable parasitic background noise (parasitic electromagnet signals coming from the radio, high voltage installations) and various influencing loads which may drown out a useful signal in a considerable environment of background noise.

Looking again at the diagram (FIG. 2), we see that the systematic causes of the weakening of the sensitivity of detection of the signal include the existence of the direct capacity $C_2$ between each pair of emitting electrodes A and receiving electrodes B, since the intensity of the alternating signal shunted via the capacity $C_2$ totally escapes the influence of the user's finger, and therefore corresponds to a portion of signal lost for the reading of the information. The existence of the capacity $C_2$ is therefore another disadvantage of the capacitive keyboards.

The present invention relates precisely to a capacitive keyboard structure which is free from the aforementioned disadvantages, inter alia inasmuch as it requires only one substrate, being therefore less expensive than the constructions mentioned hereinbefore, and enables the value of the parasitic capacity $C_2$ to be reduced.

BRIEF SUMMARY OF THE INVENTION

More precisely the invention relates to a capacitive keyboard structure, of the kind comprising in known manner on that one face of a substrate which is adjacent a user, a series of static sensitive keys each associated with a pair of electrodes, namely on the one hand an emitting electrode excited sequentially by an alternating signal delivered by an emitting line, and on the other hand a receiving electrode which is coupled capacitively to the emitting electrode by the corresponding static sensitive key and on which a receiving line collects the variations of the alternating signal as an effect of the possible presence of a user's finger in the vicinity of such static sensitive key, wherein the electrodes of one same type are disposed on such face of the substrate, the electrodes of the other type being disposed on the other face of the substrate.

The term "electrodes of one same type" means the emitting electrodes (or receiving electrodes respectively), the "electrodes of the other type" being in that case the receiving electrodes (or emitting electrodes).

In a first embodiment of the invention, therefore, the sensitive keys and emitting electrodes are disposed on one face of the substrate, in which case the receiving electrodes are disposed on the other face; in a second embodiment the sensitive keys and receiving electrodes are disposed on one face of the substrate, in which case the emitting electrodes are disposed on the other face. The invention then has the same equivalent electric circuit as that shown in FIG. 2, repeated as many times as there are sensitive keys. For instance, in the first embodiment there is lateral capacitive coupling between each emitting electrode A and the associated sensitive key G and, of course, a capacitive coupling between each receiving electrode B and the associated sensitive key G, which are disposed on either side of the substrate, the latter being made, for example, of a dielectric material such as glass.

In the structure according to the invention the problem of the crossings of the interconnecting wires no longer arises, since the structure can be of a matrix type or not, and the direct capacity $C_2$ is reduced because of the substrate thickness, which may be stated by way of non-limitity of example to be of the order of 4 to 5 mm.

According to a particular feature of the capacitive keyboard structure according to the invention, the electrodes of one same type respectively enclose the sensitive keys with which they are associated, the electrodes of the other type being disposed respectively below the sensitive keys with which they are associated.

In that case with the sensitive keys disposed in parallel rows, for each row the electrodes of one same type associated with the sensitive keys of that row are moreover all in one group, and the electrodes of the other type are moreover disposed in other parallel rows, in each of which the electrodes of another type are electrically connected to one another, so as to form a capacitive keyboard of matrix type.

According to another feature of the invention, each of the electrodes of the other type occupies a surface area of the same order of magnitude as the surface area of the sensitive key with which it is associated.

According to another special feature of the invention, at least one of such faces and other faces of the substrate is provided with a conductive casing. This to a very large extent gets rid of any parasitic background noise which might disturb the reading of the state of the keyboard by reducing the signal-to-noise ratio. However, this also produces the risk of causing parasitic capacities electrically equivalent to shunts between the receiving lines and earth.

According to another special feature of the invention, the variations in the amplitude of the alternating signal coming from each receiving line are exploited by an operational amplifier which is mounted as a current integrator, has a high open loop coefficient of amplification, of the order of 10,000 to 50,000, and is looped on itself by a feedback circuit. This enables the capacitive keyboard to be rendered insensitive to any parasitic capacities which may exist inter alia between the receiving electrodes or the receiving lines and earth.

The fact is that, since the coefficient of amplification $A_o$ is very high, close to 50,000, for example, the input voltage of the operational amplifier mounted as a current integrator is $Ve = Vs/A_o$ (Vs being the output voltage)—i.e., such input voltage is very low and close to zero. In other words, the input of the current amplifier is of very low impedance; this means that in practice the corresponding receiving line $Y_i$ is at a potential very close to earth. Consequently, the alternating signal collected on that line is substantially insensitive to parasitic shunt capacities between such receiving line $Y_i$ and earth, such capacities being thus short circuited.

According to another feature of the invention, to get rid of parasitic electromagnetic signals coming from the surroundings of the keyboard, the detection of the alternating signal coming from a receiving line is performed by subtracting from such signal the signal present on another reference line disposed in the keyboard.

The reference line used in that case can be of any nature. For example, it can be a line electrically independent of the keyboard and disposed therein, possibly even connected to an independent electrode which receives in the same manner as the emitting and receiving electrodes of the keyboard the parasitic signals which disturb the latter.

According to another feature of the invention the reference line is a second receiving line adjacent the first one.

Clearly, since the parasitic signal is present on both the receiving and the reference lines, it can be got rid of by the subtraction of two signals.

Lastly, according to another feature of the invention, an electrically insulating layer covers at least the electrodes of one same type, so that they are not spoiled by users, and also for safety reasons.

DESCRIPTION OF DRAWINGS

The invention will be better understood from the following merely exemplary, non-limitative description of embodiment thereof, with reference to the accompanying drawings, wherein.

DETAILED DESCRIPTION OF THE PREFERRED EMBODIMENTS

Figure 1:
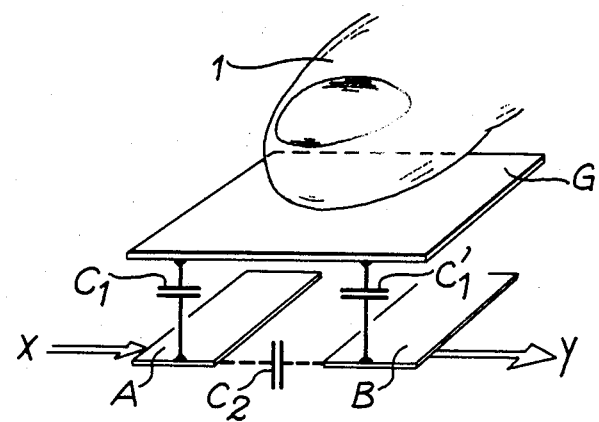
FIG. 1 is a diagrammatic view of a basic element of a known capacitive keyboard and has already been described.
Figure 2:
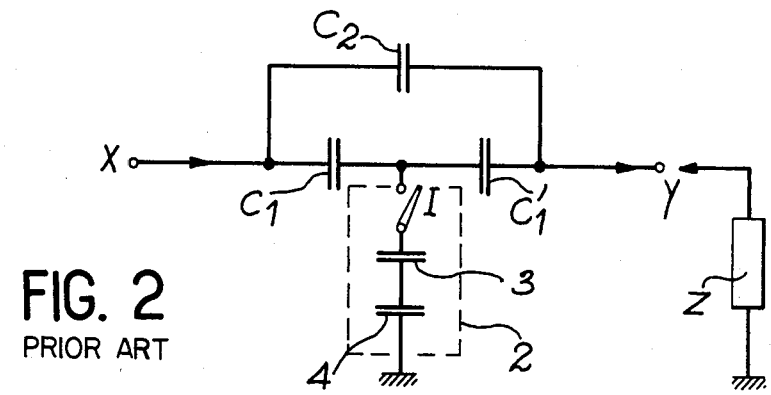
FIG. 2 is an equivalent electric circuit of a basic element of a capacitive keyboard structure and has already been described.
Figure 3:
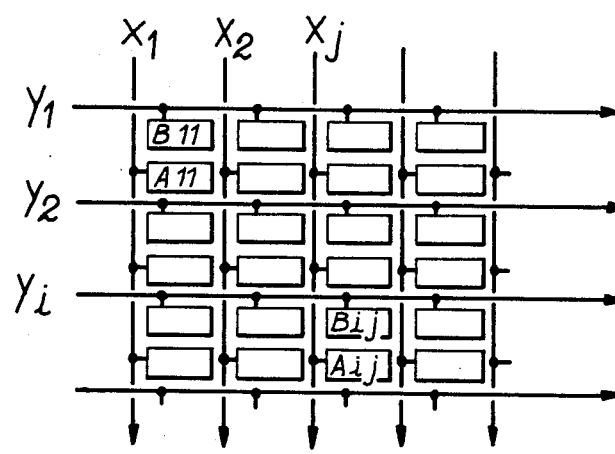
FIG. 3 is a diagrammatic view of a matrix-type capacitive keyboard and has already been described.
Figure 4:
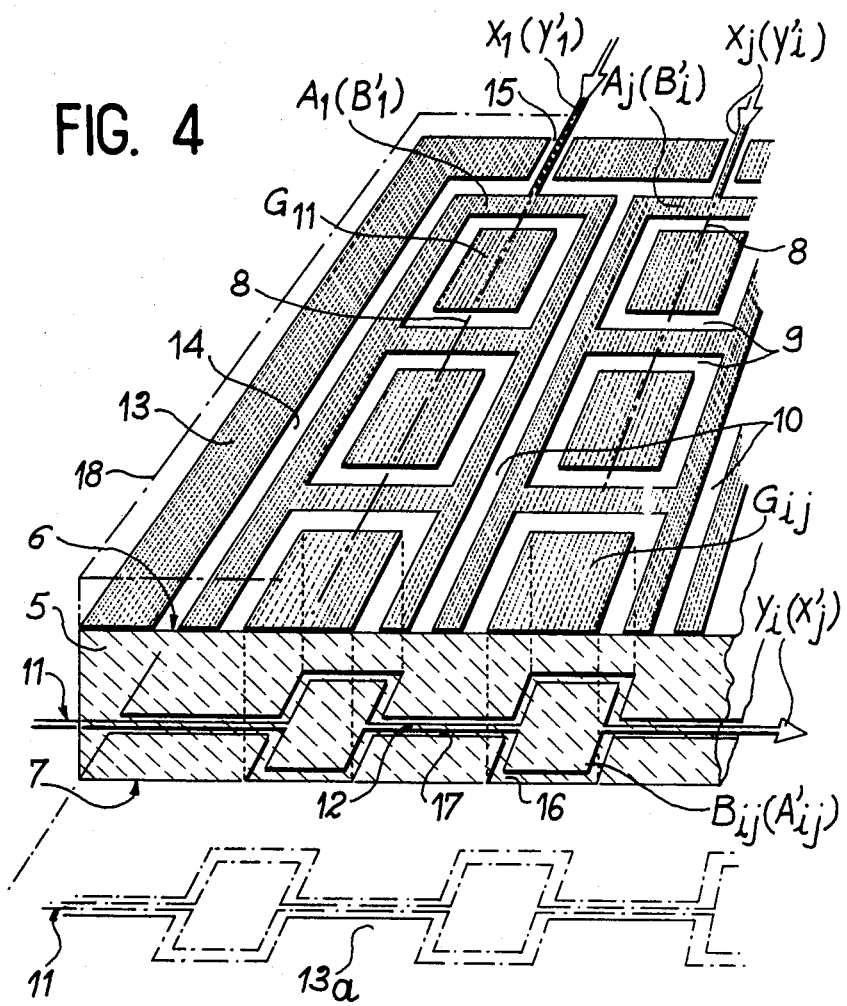
FIG. 4 is a diagrammatic view of the preferred embodiment of the capacitive keyboard structure according to the invention.

FIG. 4 shows diagrammatically a preferred embodiment of the capacitive keyboard structure according to the invention. The keyboard comprises an insulating substrate formed, for example, by a glass plate 5, only a portion of which is visible, and which has been cut away to make the drawing clearer. The glass plate 5 has an upper face 6 on which static sensitive keys $G_{ij}$ in the form of electrodes are disposed, and emitting electrodes $A_j$ and also a lower face 7 on which receiving electrodes $B_{ij}$ are disposed.

The sensitive keys $G_{ij}$ are disposed in parallel rows 8. For each row 8 the emitting electrodes enclose the sensitive keys $G_{ij}$ with which they are respectively associated, and they are moreover in one single group—i.e., not individualized—so that there corresponds to each row 8 a "emitting multi-electrode" $A_j$ which takes the form of a ladder enclosing the sensitive keys $G_{ij}$ of such row, electrically insulating spaces 9 being left between each emitting electrode $A_j$ and the sensitive keys $G_{ij}$ of the row 8 with which such electrode is associated. Electrically insulating spaces 10 are also left between all the emitting electrodes $A_j$.

FIG. 4 also shows emitting lines $X_j$ supplying such alternating signals to the emitting electrodes $A_j$.

Each receiving electrode $B_{ij}$ is disposed below the sensitive key $G_{ij}$ with which it is associated. The receiving electrodes $B_{ij}$ are also disposed in other parallel rows 11 perpendicular with the rows 8. In each of the other rows 11, the receiving electrodes $B_{ij}$ are electrically connected to one another via conducting lines 12 directed in accordance with the other rows 11. The various receiving lines $Y_i$ which prolong the conducting lines 12 are also shown.

The resulting capacitive keyboard is one of a matrix type, with non-individualized emitting electrodes, although of course the invention might also be put into effect by depositing on the plate 5 emitting (and receiving) electrodes which are independent of one another, and each of which can even be associated with an emitting (or receiving) line.

Of course a keyboard must also be imagined in which the receiving electrodes of the other row 11 were not individualized, but reduced to a small metallic strip.

A metallic casing 13 can be placed over the periphery of the upper face 6, an electrically insulating space 14 being left between the casing and the emitting electrodes $A_j$, and electrically insulating channels 15 also being provided through which the emitting lines $X_j$ pass. A metal casing 13a can also be placed on the lower face 7, electrically insulating spaces 16 being left around the receiving electrodes $B_{ij}$, and electrically insulating channels 17 being provided through which the conductive lines 12 pass. The casings 13 and 13a are, for instance, connected to a fixed potential, which can be inter alia that of earth. This more particularly gets rid of any outside parasitic influence which might disturb the reading of the state of the keyboard.

The emitting electrodes $A_j$ can be insulated from the users by covering the upper face 6 with an electrically insulating layer 18 which at the same time protects the sensitive keys $G_{ij}$.

Figure 5:
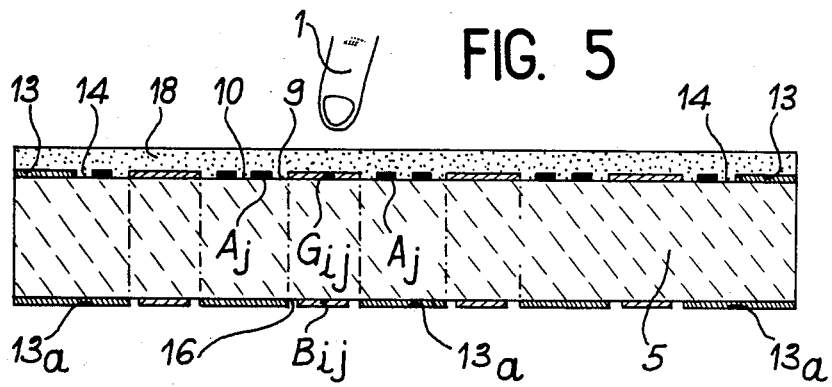
FIG. 5 is a diagrammatic sectional view of the preferred embodiment of the capacitive keyboard structure according to the invention.

FIG. 5 is a sectioned diagrammatic view of the capacitive keyboard illustrated in FIG. 4. FIG. 5 also shows the finger 1 of a user placed adjacent a sensitive $G_{ij}$.

The emitting electrodes $A_j$ and receiving electrodes $B_{ij}$, and also the sensitive keys $G_{ij}$, are made, for example, from indium and/or tin oxides, electrically conductive, transparent materials which can be deposited on their respective faces chemically or by a vacuum coating technique, in known manner. The insulating layer 18 has, for example, a thickness of the order of 0.1 mm to 1 mm, and can be applied to the upper face 6 by deposition or silk screen printing. The layer 18 can also be transparent (an $SiO_2$ layer, or a layer of adhesive plastic), so that a transparent capacitive keyboard can be produced, having application such as controlling the lighting of particular points on a public panel disposed below the keyboard.

The total surface area of a receiving electrode $B_{ij}$ and of the insulating space 16 enclosing it is, for example, equal to the surface area of the associated sensitive key $G_{ij}$; this is shown by dotted lines in FIG. 4. In that case, still by way of example, rectangular or square keys $G_{ij}$ can be produced having sides of 15 to 35 mm, enclosed by an insulating space 1 to 2 mm wide, the associated receiving electrodes $B_{ij}$ being rectangles or squares enclosed by an insulating space 1 to 2 mm wide. Space is therefore better used in the capacitive keyboard structure according to the invention than in the prior art capacitive keyboards.

Moreover, according to the invention the active capacities $C_1$ and $C_1'$ can readily be adjusted by acting on the surface of a receiving electrode and the width of the gap separating an emitting electrode from the associated sensitive key.

Referring again to FIG. 4, of course the arrangement of the emitting and receiving electrodes could be reversed: the upper face 6 could receive the receiving electrodes $B'_i$, in that case not-individualized, associated with the receiving lines $Y'_i$ and enclosing the sensitive keys $G_{ij}$, the lower face 7 having the emitting electrodes $A'_{ij}$ in this case individualized, associated with the receiving lines $X'_j$ and disposed below the sensitive keys $G_{ij}$, the arrows in FIG. 4 corresponding to the lines $X'_j$ and $Y'_i$ being reversed.

Figure 6:
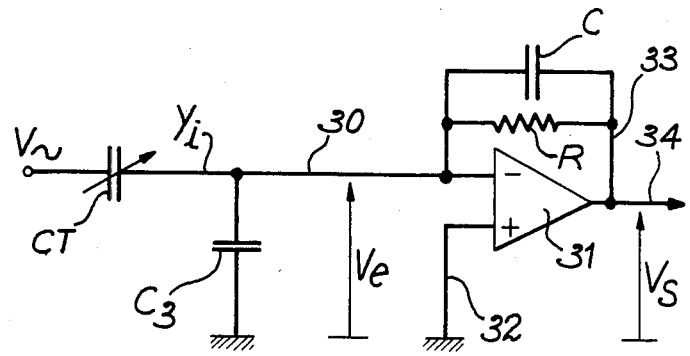
FIG. 6 is a diagrammatic view of an electronic circuit enabling the capacitive keyboard structure according to the invention to be rendered insensitive to certain parasitic capacities.

FIG. 6 shows diagrammatically an electronic circuit enabling the capacitive keyboard structure according to the invention to be rendered insensitive to certain parasitic capacities which may exist inter alia between the receiving electrodes or the receiving lines and earth, because of the presence of a casing in the capacitive keyboard.

FIG. 6 shows a receiving line $Y_i$ having the reference 30 on which an alternating signal is present of amplitude V, whose possible variations must be detected under the influence of a user's finger shown diagrammatically by the presence of a variable capacity CT. A capacity $C_3$ representing the whole of the parasitic capacities whose effects must be suppressed is shunted between the receiving line 30 and earth. The receiving line 30 is connected to the negative input of an operational amplifier 31 mounted as a current integrator and having a gain $A_o$ in open loop of the order of 10,000 to 50,000. The positive input of the operational amplifier 31 is earthed by the connection 32, and a feedback loop 33 comprising in parallel a capacity C and a resistance R connects the output and the negative input of the operational amplifier 31. The resistance R has a very high value, of the order, for example, of 10M ohm, to define the direct input potential of the amplifier 31. The useful signal transmitted to the reading electronics is therefore available at the output 34 of the amplifier 31. If we call the input and output voltages of the amplifier Ve and Vs, we have the relationship $Ve = Vs/A_o$, with $A_o$ differing very little from 50,000. Consequently Ve is very close to zero—i.e., the voltage at the terminals of the capacity $C_3$, which represents the whole of the parasitic capacities which are to be got rid of, is very low, and therefore the current flowing in $C_3$ is negligible. The action of $C_3$ on the current entering the amplifier 31 is therefore practically zero. It may also be noted that the gain of the assembly thus looped is defined by the relationship CT/C, a formula in which CT is the variable capacity represented by the presence of a finger adjacent a sensitive key.

The use of an operational amplifier to get rid of parasitic capacities is already known, with different special embodiments, but only in the field of prior art capacitive keyboard structures. An engineer is the art might adapt these various embodiments, of which FIG. 6 is merely a non-limitative example, to the invention without exceeding its scope.

Figure 7:
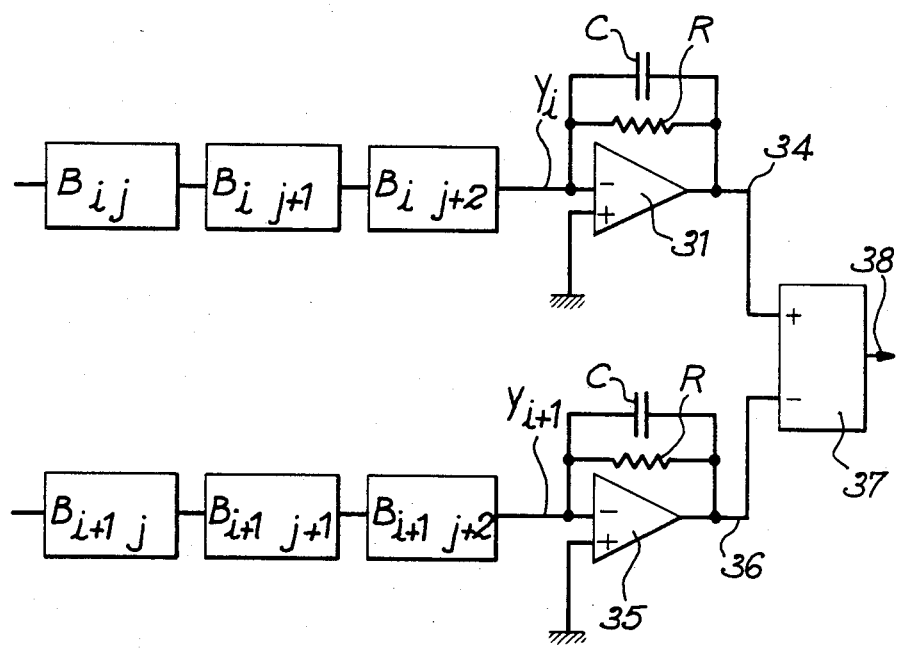
FIG. 7 is a diagrammatic view of the electronic circuit, so completed that it can deliver at the output a working signal free from any parasitic electromagnetic component which may have got into the keyboard.

FIG. 7 shows diagrammatically the electronic circuit of FIG. 6, the circuit being modified so as to get rid of any parasitic signals which may have got into the keyboard. FIG. 7 shows two adjacent receiving lines $Y_i$ and $Y_{i+1}$ which belong to a matrix type reading system of the keyboard and which each supply the negative input of an operational amplifier (i.e., 31 and 35 respectively), each of the operational amplifiers 31 and 35 comprising a feedback loop similar to that already described. The line $Y_i$ collects the signals coming from the receiving electrodes $B_{ij}$, $B_{ij+1}$ and $B_{ij+2}$, and the receiving line $Y_{i+1}$ collect the signals coming from the receiving electrodes $B_{i+1j}$, $B_{i+1j+1}$ and $B_{i+1j+2}$. According to the invention the outputs of the amplifiers 31 and 35 are connected respectively via lines 34 and 36 to a subtractor 37 which delivers at the output 38 a signal free from all parasitic components since, if such a component were present in the keyboard at the time of measurement, it would be present at one and the same time on the line $Y_i$ and on the line $Y_{i+1}$, and the fact of performing the subtraction of the two corresponding signals in the subtractor 37 therefore enables it to be eliminated.

The use of a subtractor to get rid of such parasitic signal is known, with different special embodiments, but only in the field of prior art capacitive keyboard structures. An engineer in the art might adapt these various embodiments, FIG. 7 being given merely by way of non-limitative example, to the invention without exceeding its scope.

What is claimed is:

1. A capacitive keyboard structure comprising a substrate having an upper face which is positioned for access by a user and having a lower face, a series of static sensitive keys disposed on the upper face, each key being associated with a first and a second electrode, one of said electrodes being an emitting electrode which is excited sequentially by an alternating signal delivered by an emitting line connected to said emitting electrode, and the other of said electrodes being a receiving electrode which is coupled capacitively to the emitting electrode by the associated static sensitive key and which impresses on a receiving line connected to the receiving electrode variations of the alternating signal as an effect of the presence of a user's finger in the vicinity of such static sensitive key, the first electrode being formed to enclose on the upper face its associated key, and the second electrode being disposed on the lower face below the associated key.

2. A capacitive keyboard structure according to claim 1, wherein, the sensitive keys are disposed in parallel rows, the first electrodes associated with the sensitive keys of each row being electrically connected together as a group, and the second electrodes being disposed in other parallel rows with the second electrodes of each of said other parallel rows being electrically connected to one another, so as to form a capacitive keyboard of the matrix type.

3. A capacitive keyboard structure according to claim 1, wherein the second electrode occupies a surface area on the lower face which is of the same order of magnitude as a surface area on the upper face occupied by the sensitive key with which it is associated.

4. A capacitive keyboard structure according to claim 1, wherein at least one of such faces of the substrate is provided with a conductive casing.

5. A capacitive keyboard structure according to claim 1, wherein, for sensing the variations in the amplitude of the alternating signal on the receiving line, an operational amplifier which is configured as a current integrator is connected to the receiving line, the amplifier having a high open loop coefficient of amplification, of the order of 10,000 to 50,000, and being looped on itself by a feedback circuit.

6. A capacitive keyboard structure according to claim 1, wherein, to get rid of the effect of parasitic electromagnetic signals coming from the surroundings of the keyboard, the alternating signal on the receiving line has substracted therefrom a signal present on a reference line disposed in the keyboard.

7. A capacitive keyboard structure according to claim 6, wherein the reference line is a second receiving line adjacent the first-mentioned receiving line.

8. A capacitive keyboard structure according to claim 1, wherein an electrically insulating layer covers at least the first electrodes.

9. A capacitive keyboard structure according to claim 2, wherein the first electrodes of each first-mentioned parallel row are connected together in a ladder configuration.

10. A capacitive keyboard structure according to claim 1, wherein said first and second electrodes and said sensitive keys comprise layers of electrically conductive transparent materials disposed at predetermined locations on the upper and lower faces of the substrate.

11. A capacitive keyboard comprising a rigid substrate having an upper face and a lower face, a plurality of static touch-sensitive keys disposed in parallel rows on the upper face of the substrate, each key being defined by a layer of electrically conductive material disposed in a predetermined area on the upper face, a first electrode for each row of keys, the first electrode comprising a layer of electrically conductive material having first and second portions disposed on opposite sides of the keys of the row and extending parallel to the direction of the row, and having a plurality of transversely extending third portions connected to the first and second portions and disposed between each of the keys such that each key of the row is enclosed by the first electrode, a first signal line connected to the first electrode of each row, a plurality of second electrodes, one for each key, disposed on the lower face of the substrate, each second electrode comprising a layer of electrically conductive material having a surface area of the same order of magnitude as a surface area on the upper face occupied by the key with which it is associated and being disposed directly below its associated key, the second electrodes being connected together in other parallel rows which extend perpendicular to said first-mentioned parallel rows of keys, and each such row of second electrodes being connected to a second signal line, and wherein one of said first and second electrodes is an emitting electrode which is excited sequentially by an alternating signal delivered on its signal line and the other electrode is a receiving electrode which is capacitively coupled to the emitting electrode by an associated key and which receives variations of the alternating signal as an effect of the presence of a user's finger in the vicinity of such key.

* * * * *